United States Patent
Ito et al.

(10) Patent No.: US 6,271,621 B1
(45) Date of Patent: Aug. 7, 2001

(54) PIEZOELECTRIC PRESSURE SENSOR

(75) Inventors: Masahiko Ito, Kashihara; Takeshi Nagai, Kitakatsuragigun; Yuko Fujii, Yamatokoriyama; Hiroyuki Ogino, Nara, all of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/366,053

(22) Filed: Aug. 2, 1999

(30) Foreign Application Priority Data

| Aug. 5, 1998 | (JP) | 10-221376 |
|---|---|---|
| Feb. 12, 1999 | (JP) | 11-034062 |
| Feb. 24, 1999 | (JP) | 11-046223 |

(51) Int. Cl.⁷ ................................ H01L 41/08
(52) U.S. Cl. ............................ 310/358; 310/800
(58) Field of Search ..................... 310/800, 358

(56) References Cited

U.S. PATENT DOCUMENTS

| 4,128,489 | * | 12/1978 | Seo | 252/62.9 |
| 4,191,193 | * | 3/1980 | Seo | 128/675 |
| 4,278,000 | | 7/1981 | Saito et al. | 84/1.16 |
| 4,369,391 | * | 1/1983 | Micheron | 310/800 |
| 4,443,730 | * | 4/1984 | Kitamura et al. | 310/330 |
| 4,568,851 | | 2/1986 | Soni et al. | 310/800 |
| 4,849,946 | | 7/1989 | Beauducel | 367/155 |

FOREIGN PATENT DOCUMENTS 62-92381 * 4/1987 (JP) .................. H01L/41/08

OTHER PUBLICATIONS

"Piezoelectric Flexible Composites Consist of Piezoelectric Ceramic Powder and Synthetic Rubber"; hisao Banno et al.; Huntai to Kogyo, vol. 22 (No. 1) p 53–54 Dec. 1990.

"Assessment of Degree of Poling in 0–3 Piezoelectric Composites by X–ray Methods"; Karl F. Schoch et al.; Ferroelectrics, vol. 77; pp. 39–46, Dec. 1988.

"Flexible Composite Piezoelectric Sensors"; R. E. Newnham et al.; Ultrasonic Symposium pp 501–506 Dec. 1984.

* cited by examiner

Primary Examiner—Thomas M. Dougherty
(74) Attorney, Agent, or Firm—Parkhurst & Wendel, L.L.P

(57) ABSTRACT

Two kinds of pressure sensors using a piezoelectric composite comprising amorphous chlorinated polyethylene, crystalline chlorinated polyethylene and piezoelectric ceramic powder are disclosed. The first is a piezoelectric cable comprising an inner conductor of a metal helix, the volume within the metal helix is filled with fine insulating polymer fibers, a piezoelectric composite layer circumferentially surrounding the inner conductor, and an outer conductor of a metal film attached on a polymer membrane. The metal film is in contact with said composite layer but separated from the inner conductor and a protective jacket. The second type of pressure sensor is a planar sensor comprising a piezoelectric composite in a planar form sandwiched with conductors of two metal films attached on two polymer membranes, each metal film is in contact with the composite but separated from each other.

17 Claims, 5 Drawing Sheets

PIEZOELECTRIC PRESSURE SENSOR

FIELD OF THE INVENTION

This invention relates to a pressure sensor using a piezoelectric composite. Two types of sensors are disclosed herein.

BACKGROUND OF THE INVENTION

Piezoelectric pressure sensors have many applications such as underwater hydrophones, strain sensors and vibration sensors. Many types of piezoelectric sensors have been proposed regarding different piezoelectric materials, methods of construction and various other features.

For example, piezoelectric cables are disclosed in U.S. Pat. Nos. 4,278,000, 4,568,851 and 4,849,946. As the typical inner conductor, there are disclosed a single metal wire, a small twisted steel wire of about 0.3 mm in diameter and a conductive polymer layer. Since flexibility is very significant in the piezoelectric cable, piezoelectric polymers and piezoelectric composites are used as the piezoelectric material. As the typical piezoelectric polymer, polymers such as polyvinylidene fluoride(PVDF), polyvinyl difluoride/trifluoride ethylene copolymer (VDF/TrFE) and the like are disclosed. As the typical piezoelectric composite, composites such as silicone rubber, chloroprene rubber, urethane rubber and the like containing piezoelectric ceramic powders such as lead titanate (PbTiO3), solid solution of lead titanate-lead zyrconate (PbTiO3—PbZrO3) and the like are disclosed. As the outer conductor, there are disclosed a vacuum deposited metal film, a coated film of a conductive paste, a metal foil, a conductive rubber or polymer layer and others. As the protective jacket, polyethylene or polyvinyl chloride are known to be used.

The piezoelectric composites described above are often required to be cured to increase the physical strength and thermal stability. For example, a composite comprising chloroprene rubber and lead titanate is cured at 170° C. under a pressure of 150 kg/cm$^2$ after they are mixed, as reported in "Huntai to Kogyo" Vol. 22, No. 1, p. 53–54 , 1990. Other composites are also cured, as reported in 1984 Ultrasonic Symposium, p. 504 and "Ferroelectronics", Vol. 77, p. 39 , 1988. Since curing requires a particular apparatus and process, the composite is preferably produced without curing.

The conventional piezoelectric polymers and composites described above are thermally stable at a temperature less than 70–100° C. However, when the coaxial cables are applied in temperature applications above 100° C., for example in a electrical heating blanket, a temperature near a heating wire increases to about 120° C. at maximum. In this case, high thermal stability is required at 120° C.

Vacuum deposited or coated films are one of the most suitable outer conductors because of their low mechanical impedance. However, when producing these films, an expensive apparatus and complicated processes are required. For example, when a vacuum deposited metal film is produced, there are required a vacuum depositing apparatus equipped with an evacuating system, an evaporating system and other necessary apparatuses. Moreover, many processes are required such as valve operations and deposition operations to deposit the metal film around the circumferential surface of the piezoelectric layer under suitable conditions such as cleaning the surface of the piezoelectric layer, deposition rate control, deposition temperature control, film thickness control and others. When a coated film is used, there are also required an expensive coating apparatus and several complicated processes. When a thin metal foil is used as the outer conductor, an expensive apparatus and complicated processes are not required. However, the metal foil is problematic because it is often difficult to firmly wind the metal foil around the circumferential surface of the piezoelectric layer because of the weak physical strength of the metal foil. For example, a thinner aluminum foil less than 15 μm in thickness is easily broken by hand. The conductive rubber or polymer layers are advantageous because these layers can be produced by the same extruding process as the piezoelectric and protective layers. However, when the rubber or polymer layers are used as the outer conductor, an expensive extruding apparatus and complicated processes are required.

On the other hand, many planar pressure sensors have also been developed. As the piezoelectric material, piezoelectric ceramics such as lead titanate (PbTiO3), solid solution of lead titanate-lead zyrconate (PbTiO3—PbZrO3) and the like are also used together with piezoelectric polymers and piezoelectric composites described above, as shown in "Piezoelectric Ceramic" (Bernard Jaffe, William R. Cook Jr. and Hans Jaffe, Academic Press, 1971, p. 262). Metal films such as gold, palladium and platinum have been fired or evaporated on the piezoelectric ceramics as the conductor. However, the piezoelectric ceramics cannot be applied to a curved surface because of their brittle property.

SUMMARY OF THE INVENTION

An object of the present invention is to provide a piezoelectric composite with high thermal stability, which can be produced without curing.

Another object of the present invention is to provide a conductor, which can be used both as a outer conductor in a piezoelectric cable and as a conductor in a planar pressure sensor.

Still another object of the present invention is to provide a cable, which can detect not only pressure but also temperature.

The present invention discloses two kinds of pressure sensors using a piezoelectric composite comprising amorphous chlorinated polyethylene, crystalline chlorinated polyethylene and piezoelectric ceramic powder. The first type is a piezoelectric cable comprising an inner conductor of a metal helix. The volume within the metal helix is filled with insulating fine polymer fibers. A piezoelectric composite layer circumferentially surrounds the inner conductor; an outer conductor of a metal film is attached on a polymer membrane. The metal film contacting the composite layer is separate from the inner conductor and a protective jacket of an insulating and elastic material surrounding the outer conductor. The second type is a planar sensor comprising a piezoelectric composite in a planar form sandwiched with conductors of two metal films attached on polymer membranes. Each metal film contacting the composite is separated from each other.

When temperature is also required to be detected along with pressure by the piezoelectric cable, the present invention provides a cable which can detect both pressure and temperature, where a temperature is detected from a temperature dependence of resistance of the metal helix of the inner conductor.

DESCRIPTION OF THE PREFERRED EMBDIMENTS

Figure 1:
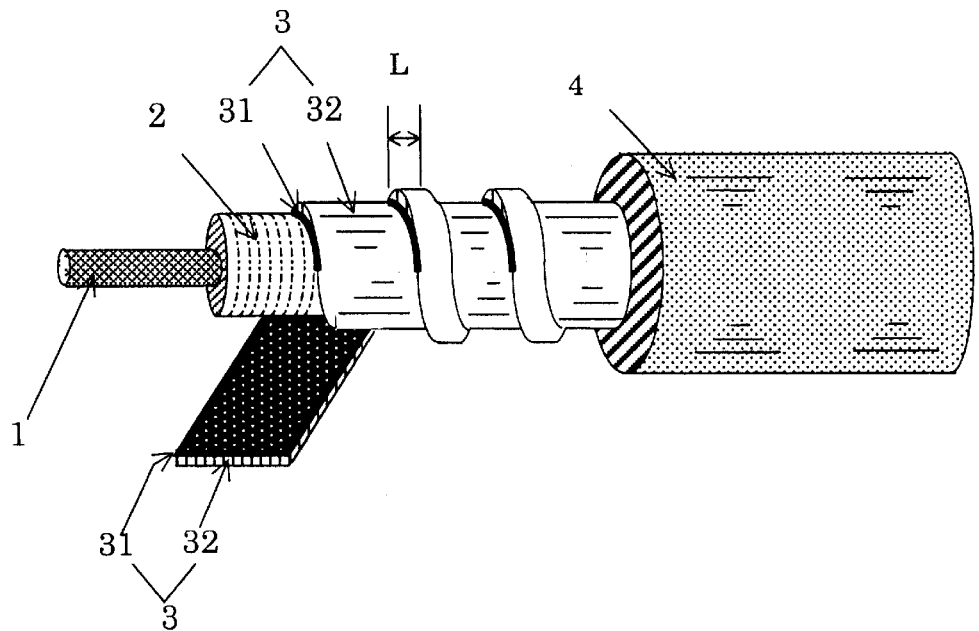
FIG. 1 is a schematic view of a piezoelectric cable according to the present invention.

Referring to FIG. 1, there is shown a preferable construction of a piezoelectric cable according to the present invention comprising an inner conductor 1 such as a single metal wire or a small twisted steel wire, a piezoelectric composite layer 2 circumferentially surrounding the inner conductor 1, the composite comprising amorphous chlorinated polyethylene (a-CPE), crystalline chlorinated polyethylene (c-CPE) and piezoelectric ceramic powder; an outer conductor 3 of a thin metal film 31 attached on a polymer membrane 32, the metal film 31 contacting with the piezoelectric composite layer 2 but separated from the inner conductor 1 and a protective jacket 4 of an insulating and elastic material surrounding the outer conductor 3.

The piezoelectric cable according to the present invention is produced by the following processes. Firstly, raw $PbTiO_3$-$PbZrO_3$ powder of 40–70 vol. % is added uniformly in raw CPE sheets by a rolling method. After the rolled composite sheet containing ceramic powder is cut into a small pellet form, the pellets are continuously extruded with an inner conductor 1 to form the piezoelectric composite layer 2. Next, the outer conductor 3 is wound around the piezoelectric composite layer 2 in such a way that the metal film 31 contacts with the piezoelectric composite layer 2. The protective jacket 4 surrounding the outer conductor 3 is also continuously extruded. Finally, a high DC electric field of (3–10)kV/mm is applied between the inner conductor 1 and the outer conductor 3 at 80–120° C. in atmosphere to polarized the piezoelectric composite layer 2.

CPE is classified as a-CPE and c-CPE in crystalline structure. When a-CPE is used as the raw CPE sheet onto which piezoelectric ceramic powder is added, it is advantageous because a large amount of piezoelectric ceramic powder up to about 80 vol. % can be added and the pellets are easily extruded. The extruded composite layer 2 is very flexible. However, since this composite layer 2 is easily deformed over 80° C. owing to its low rigidity, it is not very practical for uses and applications. In order to make this composite layer 2 rigid enough to be only slightly deformed at 120° C., the composite layer 2 may be required to be cured by the complicated processes described above. On the other hand, when c-CPE is used as the raw CPE sheet onto which piezoelectric powder is added, the composite layer 2 is not required to be cured because it is rigid enough to be only slightly deformed even at 120° C. However, it is disadvantageous because the pellets can only contain a small amount of piezoelectric ceramic powder up to about 40 vol. % and are difficult to extrude. Since the present composite comprises a-CPE and c-CPE, it has the advantages of the two CPEs. Accordingly the present composite is not required to be cured and the piezoelectric ceramic powders can be added up to about 70 vol. %.

As described above, the present composite comprises a-CPE, c-CPE and piezoelectric ceramic powder. The piezoelectric and physical characteristics of the extruded composite layer 2 depend on the molecular weight and crystallinity of the a-CPE and the c-CPE, the volume ratio of both types of CPE and the amount of the piezoelectric ceramic powder. When the molecular weight and crystallinity are low, it is difficult to achieve a composite layer 2 that has enough rigidity to be slightly deformed at 120° C. On the contrary, when the molecular weight and crystallinity are high, the composite layer 2 is difficult to extrude. The higher the amount of the piezoelectric ceramic powder, the better the piezoelectric characteristic. However, the composite layer 2 is difficult to extrude when it contains high amounts of piezoelectric ceramic powder. Considering these conditions, it has been experimentally found that the preferable mixture of a-CPE and c-CPE comprises 75 wt. % of a-CPE with 60,000~150,000 in molecular weight and 25 wt. % of c-CPE with 200,000~400,000 in molecular weight and with 15~25% in crystallinity. The piezoelectric ceramic powder can be added in this mixture up to about 70 vol. %.

Before the piezoelectric ceramic powder is added in this mixture of a-CPE and c-CPE, the powder is preferably immersed in a solution of titanium coupling agents and dried. This process causes the surface of the powder to be covered with hydrophilic and hydrophobic groups, which are contained in the liquid. The hydrophilic groups prevent the powder from aggregating and the hydrophobic groups increase the wettability of the ceramic powder to CPE. As a result, the ceramic powder can be uniformly added up to about 70 vol % in the mixture of a-CPE and c-CPE. A similar effect can be achieved by adding the titanium coupling agents when rolling the mixture and powder. This simple process is preferable because immersion in the solution is not required.

As the outer conductor 3, the assembled membrane 3 comprises the thin metal film 31 attached on the polymer membrane 32. This arrangement is preferred because the assembled membrane 3 can be easily wound with a simple apparatus in comparison with the vacuum deposition or coating apparatuses. Moreover, it is also advantageous because the assembled membrane 3 has not only high conductivity of the thin metal film 31 but also the physical strength of the polymer film 32 which is large enough to be firmly wound on the piezoelectric composite layer 2. As the assembled membrane 3, a particular membrane 3 comprising a thin aluminum film 31 attached on a polyethylene terephthalate (PET) membrane 32 is preferable because the particular membrane 3 not only has a high thermal stability at 120° C. but is commercially available. A typical assembled membrane 3 commercially available comprises an aluminum layer 31 of 6–10 μm in thickness attached on a PET membrane 32 of 10–20 μm in thickness and 3–10 mm in width. When the assembled membrane 3 is wound on the piezoelectric composite layer 2, the width of the assembled film 3 is preferably narrow because the cable can be more easily strained under a given pressure.

Figure 2:
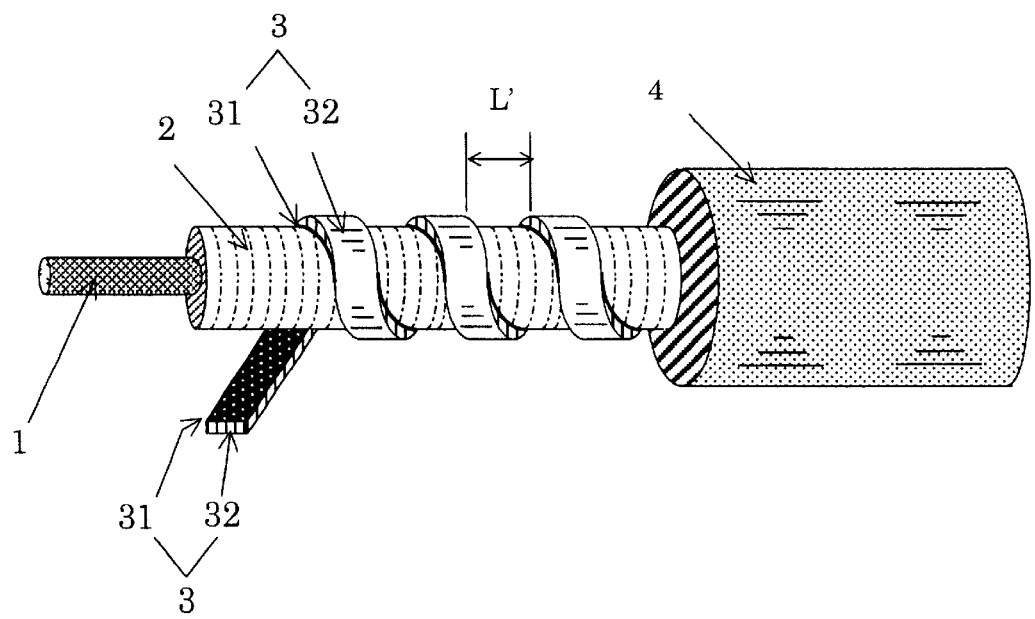
FIG. 2 is an another schematic view of a piezoelectric cable according to the present invention.

When the piezoelectric cable is used in an electrically noisy environment, the assembled membrane 3 is preferably wound in such a way that it is overlapped partially with a length L, as shown in FIG. 1. When a pressure caused by an impact of an object is applied to the cable, a potential difference is generated between the inner 1 and outer conductor 3 owing to strain of the piezoelectric composite layer 2, which is generated by the pressure. When the outer conductor 3 is kept at earth potential, the potential difference can be available because the inner conductor 1 is shielded from the environmental noise. It is also preferable that the overlapped length L (shown in Fig.1) of the assembled membrane 3 is as short as possible because the overlapped parts are resistant to strain. On the other hand, when the piezoelectric cable is used in a less noisy environment, for example in a shielded box, the assembled membrane 3 is preferably wound at a given interval L', as shown in FIG. 2, because the cable can be more easily strained by the pressure. It is preferable that the interval L' is as short as possible because the DC electric field is applied uniformly between the inner 1 and outer conductor 3 during poling.

As the protective jacket 4, an insulating and elastic polymer material such as urethane, polyethylene, polyvinylidene chloride (PVC) and the like is conventionally used.

Figure 3:
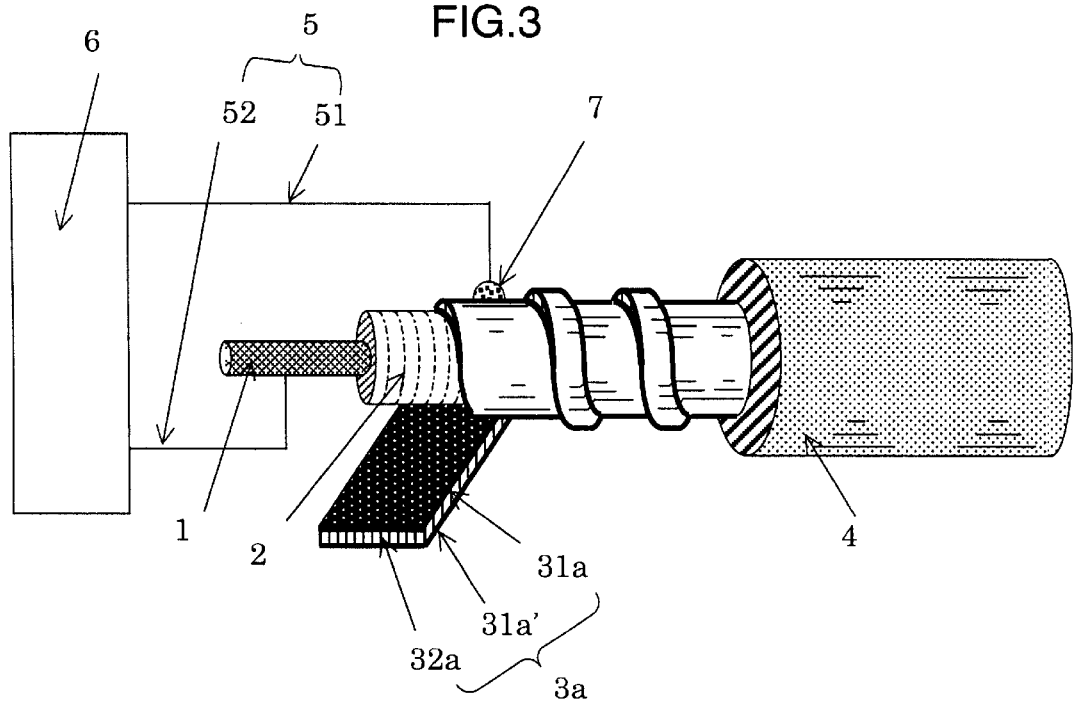
FIG. 3 is a schematic view of a piezoelectric cable according to the present invention, which illustrates a connecting means of an external lead to the outer conductor.

As shown in FIG. 3, in practical applications, external leads 51 and 52 contacting the inner conductor 1 and the outer conductor 3, respectively, are connected with a detecting means 6. When a potential difference is generated between the inner 1 and outer 3a conductors by a pressure applied to the cable, the potential difference can be detected by the detecting means 6, to which external leads 51 and 52 are connected. To achieve easy lead connection, the outer conductor 3 is preferably another assembled membrane 3a comprising a polymer membrane 32a sandwiched with metal films 31a and 31a', and the assembled membrane 3a is preferably wound in such a way that it is partially overlapped. As a result, the metal layer 31a contacting the piezoelectric composite layer 2 contacts with the metal film 31a' at the overlapped portions. Since the metal layer 31a' is external to composite layer 2, the external lead 51 can be easily connected with the metal film 31a'.

Figure 4:
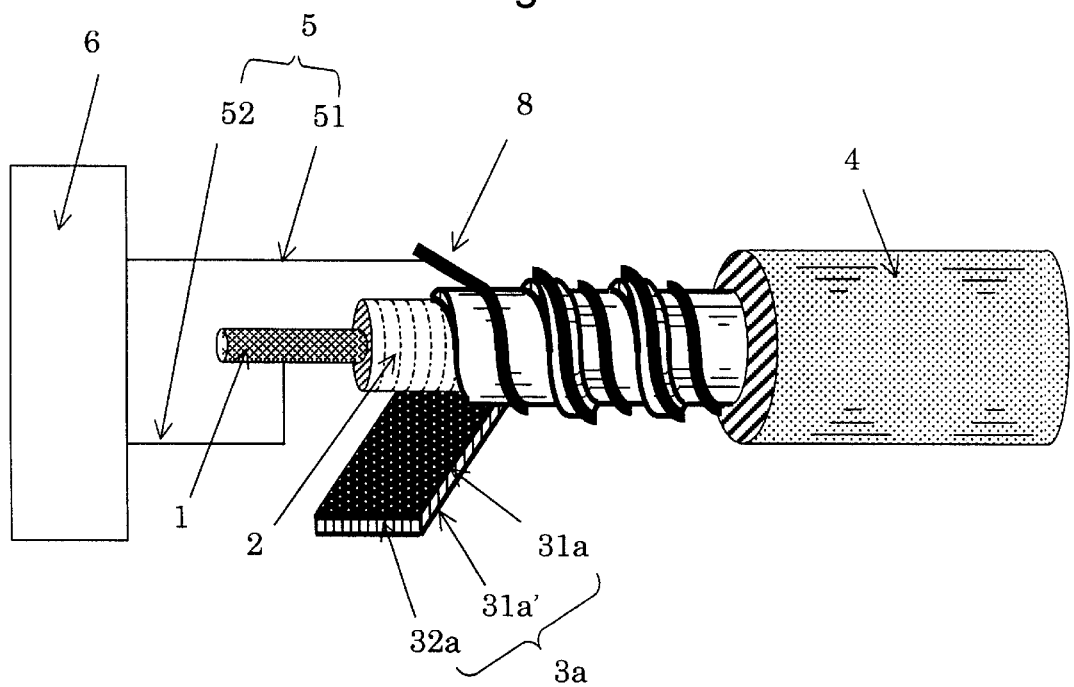
FIG. 4 is a schematic view of a piezoelectric cable according to the present invention, which illustrates another connecting means of an external lead to the outer conductor.
Figure 5:
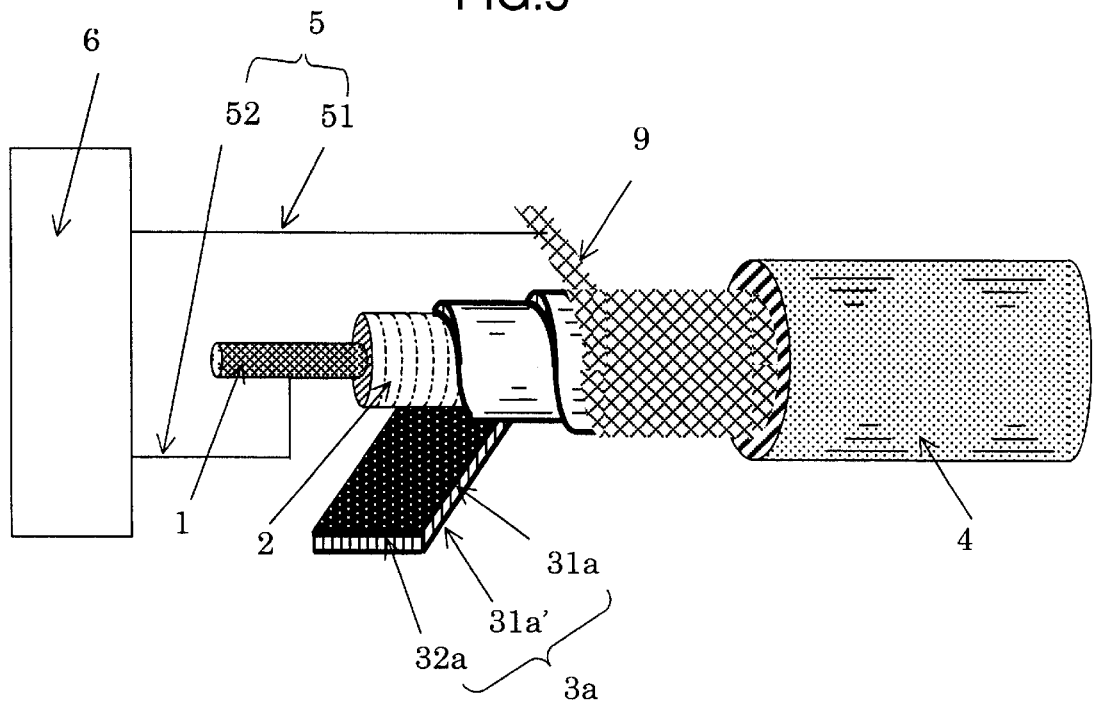
FIG. 5 is a schematic view of a piezoelectric cable according to the present invention, which illustrates another connecting means of an external lead to the outer conductor.

As described above, the aluminum and PET are preferably used as the metal film 31a and 31a' and the polymer membrane 32a, respectively. Considering that the external lead 51 cannot be connected with the aluminum film 31a by a conventional soldering or welding, there are proposed some preferable methods of connecting the external lead 51 with the aluminum film 31a' as follows. First, the external lead 51 can be connected using a conductive adhesive 7, as shown in FIG. 3. This method is preferable in its simple construction but disadvantageous in low adhesive strength. To obtain high connecting strength between the external lead 51 and the aluminum layer 31a', a single metal coil 8 or a braiding 9 of metal wires are wound physically on the aluminum film 31a, as shown in FIGS. 4 and 5, respectively. The external lead 51 can be easily connected with the metal coil 8 or the braiding 9 by soldering. On the other hand, the physical contact between the metal coil 8 or the braiding 9 and the aluminum film 31a' may be maintained with sufficient strength by the protective jacket 4. Accordingly, the external lead 51 can be firmly connected with the aluminum film 31a'. The metal coil 8 or the braiding 9 is connected electrically with the aluminum layer 31a' by their physical contact on the aluminum layer 31a'. Although a contact resistance may exist between them, the contact resistance less than 100 kΩ causes no problem when detecting a potential difference because the piezoelectric composite layer 2 is an electrical insulator.

Figure 6:
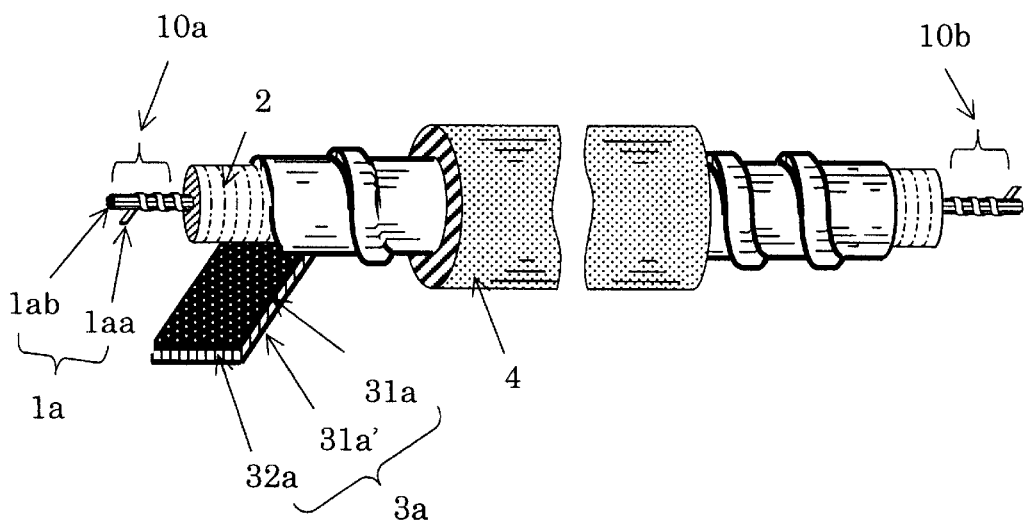
FIG. 6 is a schematic view of a piezoelectric cable according to the present invention, which can detect pressure and temperature simultaneously.

As described above, the piezoelectric composite layer 2 can operate at 120° C. over 1000 hr. However, the higher the operating temperature over 120° C., the shorter the operating time. This fact suggests that the operating temperature may be preferably detected during operation. Referring to FIG. 6, there is shown another preferable construction of a piezoelectric cable according to the present invention, where a new inner conductor 1a different from the conventional inner conductor 1 is used. The new inner conductor 1a comprises a metallic helically wound inner conductor 1aa and insulating fine polymer fibers 1ab, which fill the volume within the metal helix 1aa. As the metal helix 1aa and the fine (small in diameter) polymer fibers 1ab, copper alloy containing 5 wt. % of silver and polyester fibers are preferable, respectively, because the particular inner conductor 1a has been commercially applied in electric blankets.

Figure 7:
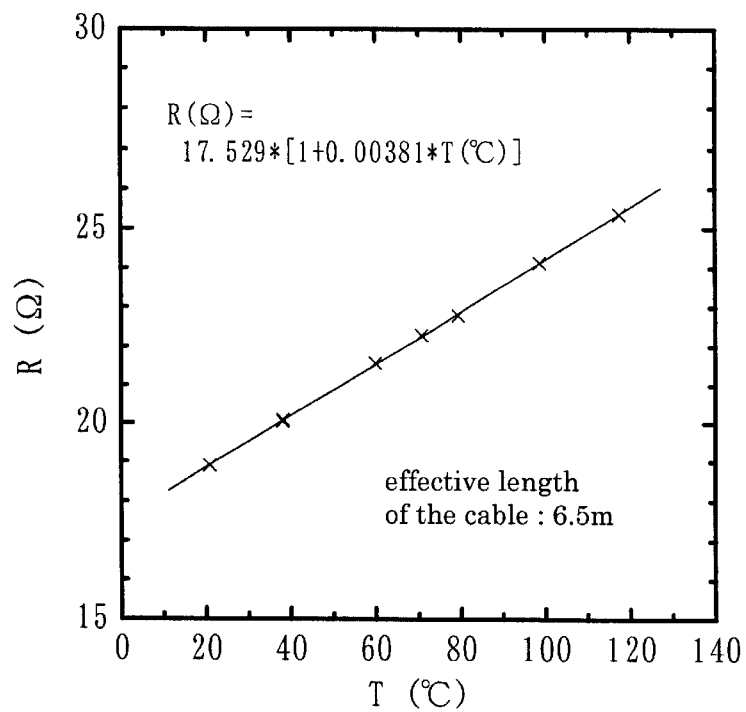
FIG. 7 shows a temperature dependence of resistance of the new inner conductor according to the present invention.

Since the new inner conductor 1a is surrounded by the piezoelectric composite layer 2, the temperature of the metal helix 1aa is almost equal to that of the piezoelectric layer 2. Since a length of the metal helix 1aa between the two edges 10a and 10b of the cable is effectively much longer than the conventional metal inner conductor 1 shown in FIGS. 1–5, the electrical resistance of the metal helix 1aa between the two edges 10a and 10b is high enough to be easily detected. Moreover, the metal helix 1aa has a large temperature coefficient of resistance. These characteristics suggest that the metal helix 1aa is suitable as a temperature sensor. For example, the typical metal helix 1aa of the particular inner conductor 1a described above is 0.3 mm in width and 0.05 mm in thickness. The resistance of this metal helix 1aa is about 2.7Ω at room temperature per unit length (1 m) of cable, which is over one magnitude higher than that of the conventional inner conductor 1 which is less than about 0.1Ω. The temperature dependence of the resistance of this metal helix 1aa of about 6.5 m in length is shown in FIG. 7. In the figure, the mark X indicates measured values and the solid line indicates the straight line obtained by the linearly approximated equation. The temperature and resistance are indicated by T and R, respectively. Since this metal helix 1aa has not only a high resistance of about 25.5Ω at 120° C. but also has a high positive temperature coefficient of resistance (TCR) of about 3800 ppm/° C., the temperature can be easily detected during operation of the cable.

Though, in the above example, a material of the metal helix is a copper alloy containing 5 wt. % of silver, a pure copper or a pure nickel metal can be used as a metal helix when a higher positive TCR is required.

Figure 8:
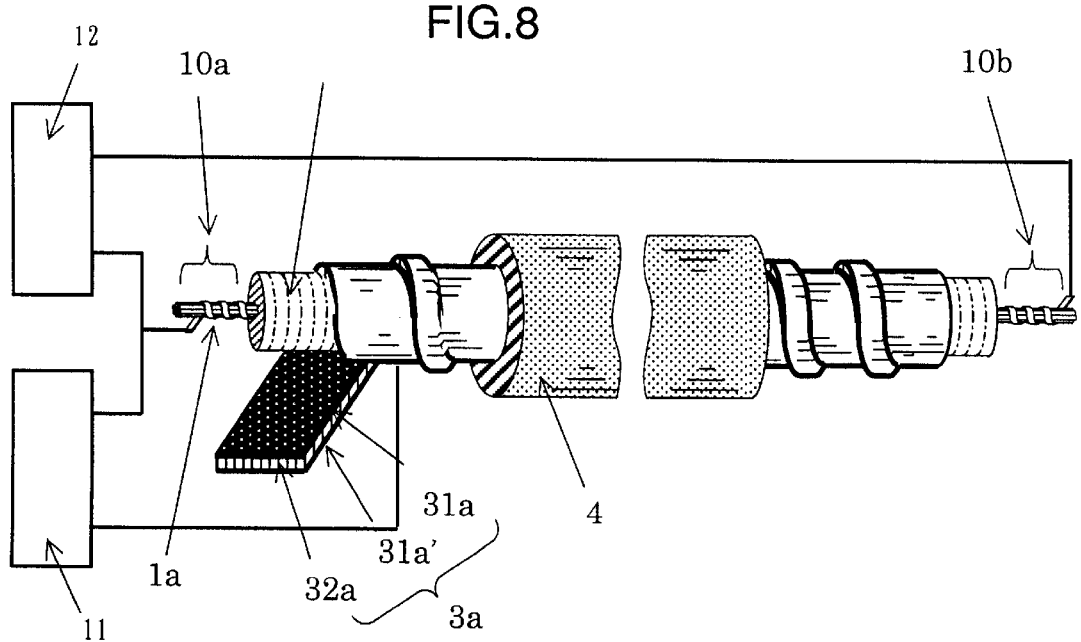
FIG. 8 shows the construction of an apparatus detecting pressure and temperature.

When pressure and temperature are required to be detected at the same time, a detecting apparatus preferably comprises the piezoelectric cable, a pressure detecting means 11 connected between the inner conductor 1a and the outer conductor 3a and a temperature detecting means 12 connected between the two ends 10a and 10b of the cable, as shown in FIG. 8. Since the two detecting means 11 and 12 can operate separately from each other, pressure and temperature can be detected at same time. When temperature increases over the normal operating temperature of the cable, a protective action such as warning or stopping of operation can be implemented. Needless to say, when the temperature is not required to be detected, the metal helix 1aa can operate as the inner conductor 1 to detect the pressure.

Figure 9:
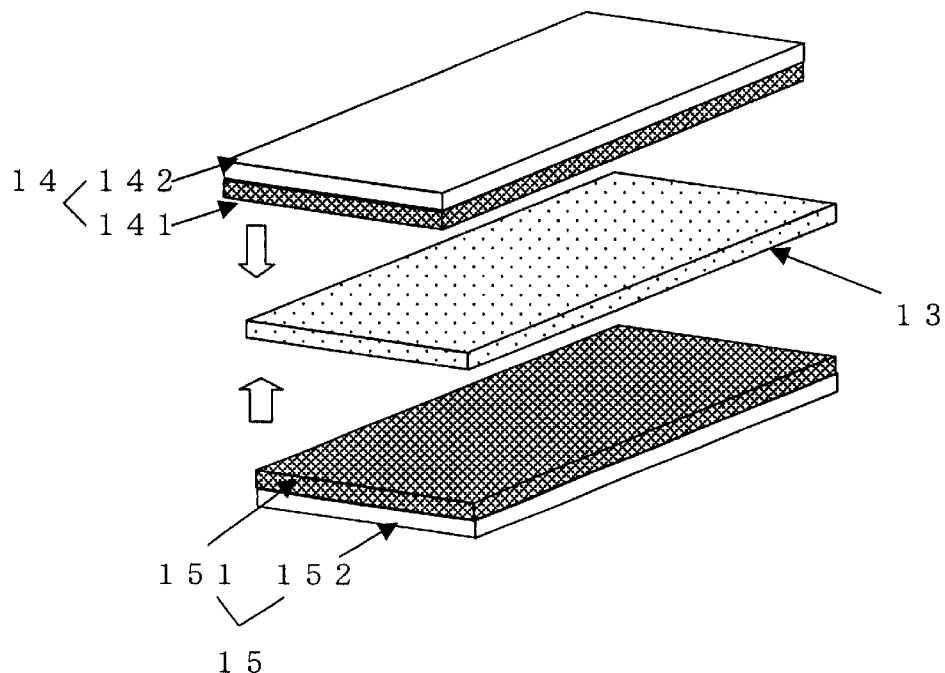
FIG. 9 is a schematic view of a planar piezoelectric pressure sensor according to the present invention.

When a pressure sensor is applied to a curved planar surface, it is obvious that a planar and flexible pressure sensor shown in FIG. 9 is advantageous in comparison with the piezoelectric cable described above. For example, when an automobile window driven by a motor is closed, it happens that fingers or hand may be pressed tightly between the window and frame. Since this accident is dangerous, it is preferred that the window is stopped at the time when a impact of fingers against the window frame is detected. Since the planar and flexible pressure sensor according to the present invention is easily attached on the curved window frame, it is available to detect the impact.

Now referring to FIG. 9 again, there is shown a preferable construction of a planar and flexible pressure sensor according to the present invention, comprising a planar piezoelectric composite layer 13 sandwiched with the assembled membranes 14 and 15. The assembled membranes 14 and 15 comprise metal films 141 and 151 attached on polymer membranes 142 and 152, respectively. The metal films 141 and 151 contact the planar piezoelectric composite 13.

As the electrode of the planar pressure sensor, the assembled membranes 14 and 15 are preferable because of their superior flexibility in comparison with a rigid conductor such as a fired metal film containing glass or thermosetting resin as a binder.

Figure 10:
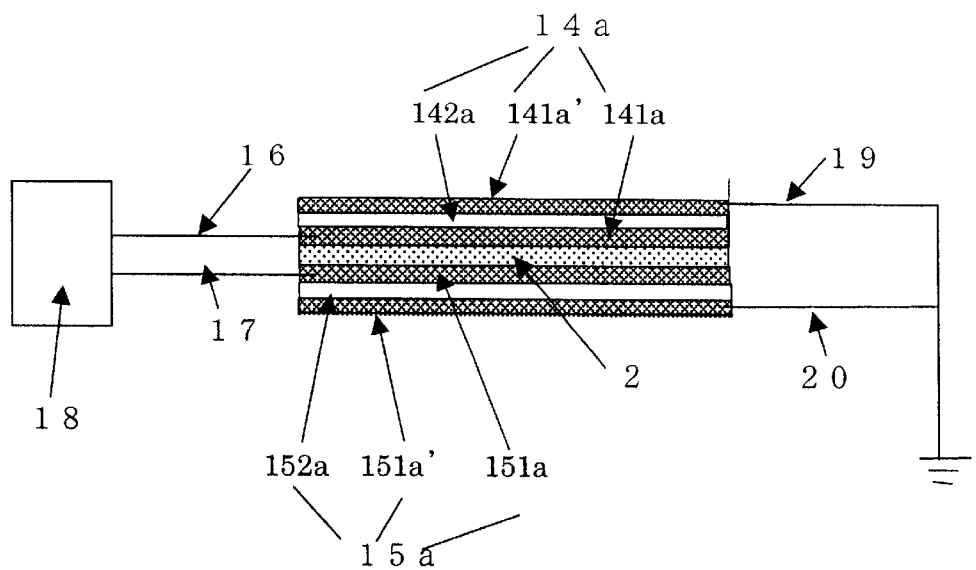
FIG. 10 is a cross-sectional view of another planar pressure sensor according to present invention.

When the planar pressure sensor is used in an electrically noisy environment, the assembled membranes 14 and 15 are preferably assembled as membranes 14a and 15a, as shown in FIG. 10. The assembled membrane 14a comprises a polymer membrane 142a sandwiched between the metal films 141a and 141a'. The assembled membrane 15a comprises also a polymer membrane 152a sandwiched between the metal films 151a and 151a'. The inner metal films 141a and 151a contact the planar composite 13. External leads 16 and 17 are connected with the inner metal films 141a and 151a, respectively. When a pressure is applied to the planar pressure sensor, a potential difference is generated between the metal films 141a and 151a. To detect the potential difference, external leads 16 and 17 are connected with a detecting means 18. When the potential difference is detected in the noisy environment, the outer metal films 141a' and 151a' are preferably kept at earth potential because the potential difference is shielded from environmental noise. For example, it is easily achieved by shorting external leads 19 and 20 connected with the metal films 141a' and 151a', respectively, for the metal films 141a' and 151a' to be kept at earth potential.

The planar and flexible pressure sensor according to the present invention is produced by the following processes. Since it is difficult to obtain the uniform and thin piezoelectric composite layer 13 by the rolling method, the rolled composite sheet is pressed at a temperature range of 120~180° C. under a pressure of 50~150 kg/cm². The uniform piezoelectric composite layer 13 of 0.1~1 mm in thickness can be produced by this process. To contact firmly the metal films 141 and 151 with the piezoelectric composite layer 13, the assembly of the piezoelectric composite layer 13 is constructed between the conductors 14 and 15 in such a way that the metal films 141 and 151 in contact with the planar piezoelectric composite layer 13 are also pressed. Finally, a high DC voltage is applied to pole the piezoelectric composite layer 13.

A fired metal film comprising thermoplastic resin such as an acrylic or a polyester resin as a binder is also preferable. This fired metal film is advantageous because it can be easily formed in various patterns. However, it is disadvantageous because particular processes are required to form a shielding conductor. This film is produced by firing the printed film of a paste containing metal particles and thermoplastic at 100~150° C. As the metal, silver is preferable because the paste comprising silver and an acrylic or a polyester resin is commercially available.

Needless to say, it is obvious that the fundamental construction of both the cable and the planar pressure sensor comprises the piezoelectric composite layer sandwiched between two conductors, which are separated from each other.

While the present invention has been described above, many modifications and changes are possible within the scope of the invention.

What is claimed is:

1. A piezoelectric pressure sensor comprising:
   first and second conductors and
   a piezoelectric composite layer between the first and second conductors, the composite layer comprising amorphous chlorinated polyethylene (CPE), crystalline CPE and piezoelectric ceramic powder.

2. The piezoelectric pressure sensor of claim 1, wherein the sensor has a cylindrical shape and the first conductor is an inner conductor,
   the piezoelectric composite layer surrounds the inner conductor,
   the second conductor is an outer conductor comprising a first metal film and a polymer membrane, the first metal film surrounding and contacting the piezoelectric composite layer, but not contacting the inner conductor, and
   a protective jacket surrounding the outer conductor.

3. The piezoelectric pressure sensor of claim 2, wherein the first metal film of the outer conductor comprises aluminum, and the polymer membrane comprises polyethylene terephthalate.

4. The piezoelectric pressure sensor of claim 2, wherein a part of the outer conductor overlaps itself as the outer conductor winds around the length of the piezoelectric composite layer.

5. The piezoelectric pressure sensor of claim 2, wherein the outer conductor winds around the length of the piezoelectric composite layer, and a space separates each successive winding from the next, leaving exposed sections of the piezoelectric composite layer.

6. The piezoelectric pressure sensor of claim 2, wherein the outer conductor further comprises a second metal film, the polymer membrane of the outer conductor sandwiched between the first and second metal films.

7. The piezoelectric pressure sensor of claim 6, further comprising an external lead attached by a conductive adhesive to the outer conductor.

8. The piezoelectric pressure sensor of claim 6, further comprising a metal wire wound on the outer conductor, and an external lead connected to the metal wire.

9. The piezoelectric pressure sensor of claim 6, further comprising a braiding of metal wires wound on the outer conductor, and an external lead connected to the braiding.

10. The piezoelectric pressure sensor of claim 2, wherein the inner conductor comprises a metallic helix and a plurality of small insulating polymer fibers.

11. A pressure and temperature sensor comprising:
    an inner conductor comprising a metallic helix and a plurality of small insulating polymer fibers,
    a piezoelectric composite layer surrounding the inner conductor, the composite layer comprising amorphous chlorinated polyethylene (CPE), crystalline CPE and piezoelectric ceramic powder,
    an outer conductor surrounding and contacting the piezoelectric composite layer but separated from the inner conductor, and
    a protective jacket comprising an insulating elastic material, the jacket surrounding said outer conductor.

12. The pressure and temperature sensor of claim 11, wherein the outer conductor is a composite membrane comprising first and second metal films and a polymer membrane sandwiched between the metal films.

13. A pressure and temperature detecting apparatus comprising a sensor, a pressure detecting means, and a temperature detecting means, wherein:
the sensor comprises:
an inner conductor having two ends,
a piezoelectric composite layer surrounding the inner conductor, the piezoelectric composite layer comprising chlorinated polyethylene and piezoelectric ceramic powder,
an outer conductor surrounding and contacting the piezoelectric composite layer, and
a protective jacket comprising an insulating elastic material, the jacket surrounding the polymer membrane;
the pressure detecting means contacts the inner and outer conductors; and
the temperature detecting means connects to the two ends of the inner conductor.

14. The pressure and temperature detecting apparatus of claim 13, wherein the inner conductor further comprises a metallic helix and a plurality of small insulating polymer fibers.

15. A piezoelectric planar pressure sensor comprising:
a first conductor comprising a first polymer membrane and a first metal film on the first polymer membrane,
a planar composite layer comprising amorphous chlorinated polyethylene (CPE), crystalline CPE and piezoelectric ceramic powder, the first metal film contacting the planar composite layer,
a second conductor comprising a second polymer membrane and a second metal film on the second polymer membrane, the second metal film contacting the planar composite layer but separated from the first metal film.

16. The piezoelectric planar pressure sensor of claim 15, wherein the first and second conductors are a composite membrane comprising two metal films and a polymer membrane sandwiched between the metal films.

17. The piezoelectric planar pressure sensor of claim 15, wherein the first and second metal films comprise aluminum, and the first and second polymer membranes comprise polyethylene terephthalate.

* * * * *